United States Patent
Wirth et al.

(10) Patent No.: US 9,520,442 B2
(45) Date of Patent: Dec. 13, 2016

(54) OPTOELECTRONIC COMPONENT

(71) Applicant: OSRAM Opto Semiconductors GmbH, Regensburg (DE)

(72) Inventors: Ralph Wirth, Lappersdorf (DE); Alexander Linkov, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/575,913

(22) Filed: Dec. 18, 2014

(65) Prior Publication Data
US 2015/0102368 A1 Apr. 16, 2015

Related U.S. Application Data

(63) Continuation of application No. 13/750,966, filed on Jan. 25, 2013, now Pat. No. 8,952,390, which is a continuation of application No. PCT/EP2011/062598, filed on Jul. 22, 2011.

(30) Foreign Application Priority Data

Jul. 26, 2010 (DE) .......................... 10 2010 038396

(51) Int. Cl.
*H01L 33/30* (2010.01)
*H01L 27/15* (2006.01)
*H01L 25/075* (2006.01)
*H01L 33/50* (2010.01)
*H01L 33/60* (2010.01)
(Continued)

(52) U.S. Cl.
CPC ........... *H01L 27/15* (2013.01); *H01L 25/0753* (2013.01); *H01L 33/30* (2013.01); *H01L 33/483* (2013.01); *H01L 33/50* (2013.01); *H01L 33/60* (2013.01); *H01L 33/56* (2013.01); *H01L 2924/0002* (2013.01); *H01L 2933/0091* (2013.01)

(58) Field of Classification Search
CPC ........ H01L 33/30; H01L 33/50; H01L 33/507; H01L 33/508
USPC .................................................... 257/76, 98
See application file for complete search history.

(56) References Cited

U.S. PATENT DOCUMENTS

| 7,777,412 B2 | 8/2010 | Pang |
| 9,024,340 B2 | 5/2015 | Minato et al. |
| 2004/0217364 A1 | 11/2004 | Tarsa et al. |

(Continued)

FOREIGN PATENT DOCUMENTS

| DE | 102007057671 A1 | 6/2009 |
| DE | 102009018088 A1 | 12/2009 |

(Continued)

*Primary Examiner* — Kenneth Parker
*Assistant Examiner* — Warren H Kilpatrick
(74) *Attorney, Agent, or Firm* — Slater Matsil, LLP (57) ABSTRACT

An optoelectronic component can be used for mixing electromagnetic radiation having different wavelengths, in particular in the far field. The optoelectronic component includes a carrier. A first semiconductor chip has a first radiation exit surface for emitting electromagnetic radiation in a first spectral range is provided on the carrier and a second semiconductor chip as a second radiation exit surface for emitting electromagnetic radiation in a second spectral range is provided on the carrier. A diffusing layer is provided on the radiation exit surfaces of the semiconductor chips which face away from the carrier.

15 Claims, 12 Drawing Sheets

(51) Int. Cl.
  *H01L 33/48* (2010.01)
  *H01L 33/56* (2010.01)

(56) References Cited

U.S. PATENT DOCUMENTS

| | | | |
|---|---|---|---|
| 2005/0045897 A1* | 3/2005 | Chou | H01L 25/0753 257/98 |
| 2005/0190561 A1 | 9/2005 | Ng et al. | |
| 2006/0138435 A1 | 6/2006 | Tarsa et al. | |
| 2006/0220046 A1 | 10/2006 | Yu et al. | |
| 2007/0228392 A1 | 10/2007 | Plank et al. | |
| 2008/0079014 A1 | 4/2008 | Ng et al. | |
| 2008/0079017 A1 | 4/2008 | Loh et al. | |
| 2009/0250714 A1* | 10/2009 | Yun | H01L 33/50 257/98 |
| 2010/0025656 A1* | 2/2010 | Raring | H01L 33/502 257/13 |
| 2010/0067233 A1 | 3/2010 | Bechtel et al. | |
| 2010/0140648 A1 | 6/2010 | Harada et al. | |
| 2011/0156071 A1* | 6/2011 | Cheng | H01L 33/44 257/98 |
| 2011/0241048 A1* | 10/2011 | Taguchi | H01L 33/60 257/98 |
| 2011/0248287 A1* | 10/2011 | Yuan | H01L 33/60 257/88 |
| 2011/0309398 A1* | 12/2011 | Ito | H01L 33/505 257/98 |

FOREIGN PATENT DOCUMENTS

| | | |
|---|---|---|
| EP | 2216834 A1 | 8/2010 |
| JP | 2007335798 A | 12/2007 |
| WO | 2004031844 A1 | 4/2004 |
| WO | 2009068007 A1 | 6/2009 |
| WO | 2009069671 A1 | 6/2009 |
| WO | 2009075530 A2 | 6/2009 |
| WO | 2010054622 A2 | 5/2010 |
| WO | 2010067817 A1 | 6/2010 |

* cited by examiner

OPTOELECTRONIC COMPONENT

This application is a continuation of U.S. application Ser. No. 13/750,966, filed Jan. 25, 2013, which is a continuation of International Application No. PCT/EP2011/062598, filed Jul. 22, 2011, which claims priority to German Application No. 10 2010 038 396.1, filed Jul. 26, 2010, all of which applications are incorporated herein by reference.

TECHNICAL FIELD

The present invention relates to an optoelectronic component for mixing electromagnetic radiation having different wavelengths.

BACKGROUND

In order to generate mixed light from electromagnetic radiation of different semiconductor chips, light boxes have been used heretofore. With the aid of the light boxes, it is only possible to generate far fields with a relatively narrow angular distribution of the intensity. In particular, there are no known optoelectronic components which make available light already mixed to the greatest possible extent at their output facets.

SUMMARY

In one aspect, the invention provides an optoelectronic component comprising semiconductor chips that emit electromagnetic radiation in different spectral ranges. The optoelectronic component makes available light already mixed to the greatest possible extent at its output facet.

Various embodiments comprise an optoelectronic component for mixing electromagnetic radiation having different wavelengths, in particular in the far field.

A first semiconductor chip having a first radiation exit surface is provided on a carrier. The first semiconductor chip emits electromagnetic radiation in a first spectral range. A second semiconductor chip having a second radiation exit surface is provided on the carrier. The second semiconductor chip emits electromagnetic radiation in a second spectral range. A diffusing layer is provided on the radiation exit surfaces of the semiconductor chips which face away from the carrier. This is advantageous since the diffusing layer results in a mixing of the electromagnetic radiation emitted by the different semiconductor chips already at the level of the optoelectronic component.

In other words, a central concept of the invention is that a diffusing layer is situated above the semiconductor chip plane, said diffusing layer diffusing and partly reflecting light that could already be coupled out directly. This is apparently at odds with the actual endeavor by the person skilled in the art to provide the highest possible transparency on the radiation exit surface. The solution presented here proposes that the carrier on which the semiconductor chips are mounted is shaped in a manner so as to be absorbent as little as possible, in order to reduce light absorption by the semiconductor chips and/or the carrier. Thus, the diffusing layer makes a significant contribution to an intermixing of the radiation emitted by the semiconductor chip. The radiation is absorbed only insignificantly despite the diffusing and a considerable portion of the (intermixed) radiation is coupled out from the optoelectronic component. The scattering particles act as an optical mixing element.

In a preferred embodiment, the semiconductor chips are based on a III-V compound semiconductor material. The semiconductor chips have at least one active zone which emits electromagnetic radiation. The active zones can be pn junctions, a double heterostructure, a multiple quantum well structure (MQW), a single quantum well structure (SQW). Quantum well structure means: quantum wells (3-dim), quantum wires (2-dim) and quantum dots (1-dim).

In a preferred embodiment, a conversion layer is provided between the radiation exit surfaces of the semiconductor chips which face away from the carrier and the diffusing layer. Said conversion layer preferably converts short-wave electromagnetic radiation into longer-wave electromagnetic radiation. Since the conversion layer is arranged between the semiconductor chips and the diffusing layer, a further radiation portion is generated which is intermixed with the other radiation portions in the diffusing layer. A spectral widening of the emitted radiation is thus obtained.

In a preferred embodiment, the first semiconductor chip is embodied as an AlGaInP semiconductor chip. The AlGaInP semiconductor chip emits electromagnetic radiation in the red and/or yellow spectral range. The use of an AlGaInP semiconductor chip is particularly advantageous in combination with a blue-emitting semiconductor chip, the spectrum of which is partly converted into the yellow spectral range by a conversion means. In the case of this combination, a warm-white color impression can be generated by the AlGaInP semiconductor chip.

In a preferred embodiment, the second semiconductor chip is embodied as an InGaN semiconductor chip. The InGaN semiconductor chip emits electromagnetic radiation in the blue and/or green spectral range. The use of an InGaN semiconductor chip for emitting radiation in the blue spectral range is particularly advantageous in order to generate white light with the aid of a conversion means.

Preferably, a plurality of AlGaInP semiconductor chips and/or a plurality of InGaN semiconductor chips can be provided. This is particularly advantageous since a high optical output power can thereby be achieved.

In a preferred embodiment, the AlGaInP semiconductor chips are arranged in the center of the optoelectronic component. The InGaN semiconductor chips can be arranged in a ring-shaped manner and/or with a uniform chip density around the AlGaInP semiconductor chips. This is advantageous since a uniform luminance can thereby be achieved.

In a preferred embodiment, the first and the second semiconductor chip are potted in a single potting, in particular in the form of a planar volume potting. The semiconductor chips are arranged in one plane. This is advantageous since a high packing density of the semiconductor chips on the carrier can thereby be achieved. In particular, silicone, epoxy resin or a hybrid material can be used as potting material.

In a preferred embodiment, a phosphorescent material is provided as conversion means in the conversion layer. Phosphor particles composed of yttrium gallium aluminum garnet and/or lutetium aluminum garnet are preferably involved. The phosphorescent material is present in a concentration of 5 to 25 percent by weight with homogeneous distribution in the conversion layer. The use of the above phosphors is particularly advantageous since the latter enable an efficient conversion of light from the blue spectral range into light from the green to yellow spectral range.

In a preferred embodiment, scattering particles are provided as diffusing means in the diffusing layer. Aluminum dioxide, silicon dioxide or titanium dioxide, in a concentration of 0.05 to 50 percent by weight, is preferably used. These particles reflect radiation in the visible range equally. This is particularly advantageous since the scattering particles elastically scatter the impinging light and contribute to an intermixing of light having different wavelengths. In particular, they do not corrupt the color impression by absorption of some wavelengths.

In a preferred embodiment, the conversion layer comprises clear potting material above the first semiconductor chip. The clear potting material can be applied to the first semiconductor chip in the form of a so-called "lens on chip." The "lens on chip" is a drop of clear potting material which was cured after being applied to the first semiconductor chip. The clear potting material above the first semiconductor chip is particularly advantageous since this prevents the undesired absorption of light by phosphorescent material in the conversion layer above the first semiconductor chip. If the first semiconductor chip is an AlGaInP semiconductor chip, the red light can penetrate through the conversion layer without absorption losses.

In a preferred embodiment, the conversion layer comprises molded glass or a silicone plate above the first semiconductor chip, in particular above the AlGaInP semiconductor chip. This is particularly advantageous since this prevents the undesired absorption of red light by phosphorescent material in the conversion layer above the AlGaInP semiconductor chip.

In a preferred embodiment, a free light mixing layer is provided on that side of the diffusing layer which faces the carrier, said light mixing layer being freed of diffusing means and conversion means. This is particularly advantageous since the light can already intermix at least partly prior to impinging on the diffusing layer. The free light mixing layer comprises silicone, epoxide or a hybrid material.

In a preferred embodiment, the semiconductor chips are embodied as surface emitters, in particular as thin-film chips. These semiconductor chips are cast up to the level of their active layers in silicone filled with titanium dioxide, $T_iO_2$, having a reflectivity of greater than 95%. Alternatively, the silicone can also be filled with $ZrO_2$, $Al_2O_3$ or ZnO. The use of highly reflective filled silicone is particularly advantageous since this prevents absorption losses as a result of exposed regions of the carrier. Alternatively, the carrier surface facing the semiconductor chips can be coated with a reflection layer, in particular composed of silver, which likewise reduces the absorption losses.

In a preferred embodiment, the diffusing layer has the form of a lens. This is particularly advantageous since a broader emission characteristic results in comparison with the diffusing layer having a homogeneous thickness, that is to say without a lens form. In other words, more light leaves the optoelectronic component at greater angles, preferably at angles of greater than 60 degrees, particularly preferably at an angle of greater than 90 degrees. The greater the angles at which the light is emitted by the optoelectronic component, the more efficiently the mixed light can be emitted by downstream reflectors in the forward direction.

In a preferred embodiment, lateral, reflective walls are provided, which are seated on the carrier. The walls are firstly advantageous since they serve as lateral delimitation during the potting of the semiconductor chips. Secondly, the walls can be designed to be highly reflective and thereby reflect more of the electromagnetic radiation emitted by the semiconductor chips in the direction of the light output facet of the optoelectronic component. The lateral walls can be perpendicular to the carrier. Alternatively, the lateral walls can be oblique with respect to the carrier. This can be advantageous since, as a result, more light can be reflected in the direction of the light exit surface of the optoelectronic component. By means of oblique walls it is possible to achieve a larger light diameter, or in other words a larger light output facet.

Various embodiments comprise a lighting device comprising an optoelectronic component and a secondary optical unit. The secondary optical unit is preferably a reflector. This is particularly advantageous since the light mixed in the optoelectronic component can be emitted in the forward direction by the downstream reflector particularly simply and efficiently.

In a preferred embodiment, the reflector has the form of a parabola at least in regions. This form of reflector is particular advantageous since a large portion of the mixed light emitted by the optoelectronic component can thereby be emitted in the forward direction.

BRIEF DESCRIPTION OF THE DRAWINGS

Various exemplary embodiments of the solution according to the invention are explained in greater detail below with reference to the drawings.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and in order to afford a better understanding.

DETAILED DESCRIPTION OF ILLUSTRATIVE EMBODIMENTS

Figure 1:
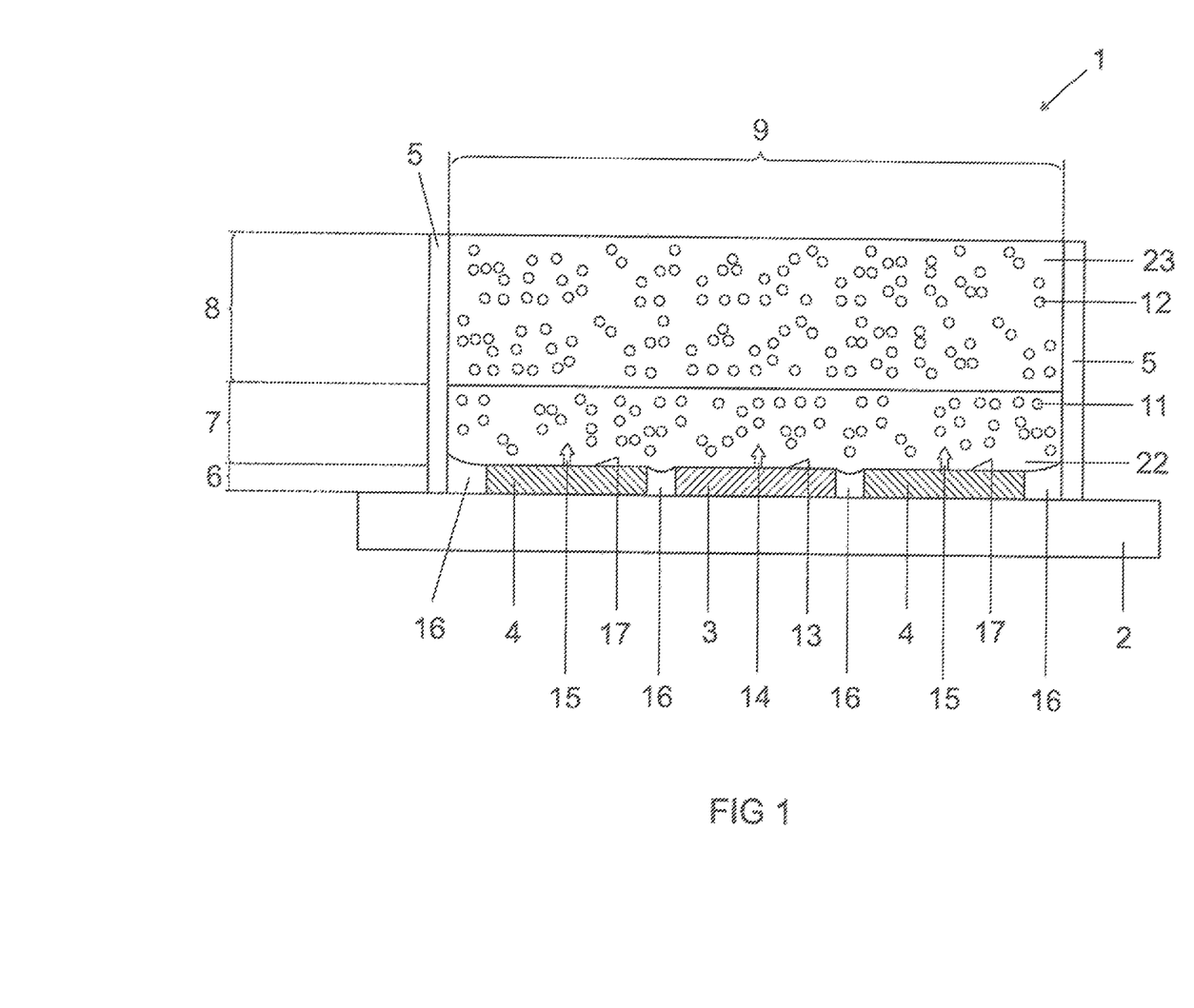
FIG. 1 shows a section through an optoelectronic component.

FIG. 1 shows a sectional view through an optoelectronic component 1. The optoelectronic component 1 serves for mixing electromagnetic radiation having different wavelengths, in particular in the far field. A first semiconductor chip 3 having a first radiation exit surface 13 for emitting electromagnetic radiation in a first spectral range 14 is provided on a carrier 2. Two further semiconductor chips 4 having a second radiation exit surface 17 for emitting electromagnetic radiation in a second spectral range 15 are provided on the carrier 2.

The semiconductor chips 3, 4 lie in one plane, the semiconductor chip plane 6. The height of said semiconductor chip plane 6 is between 0.05 mm and 0.3 mm, preferably approximately 0.2 mm. A diffusing layer 8 is provided on the first and second radiation exit surfaces 13, 17 of the semiconductor chips 3, 4 which face away from the carrier 2. Scattering particles 12, in particular aluminum dioxide, silicon dioxide or titanium dioxide, in a concentration of 0.05 to 50 percent by weight, in a potting material 23 are provided as diffusing means in the diffusing layer 8. The height of the diffusing layer 8 corresponds to the average lateral distance between the first semiconductor chip 3 and the second semiconductor chip 4. In the case of semiconductor chips having an area of 1 mm$^2$, the height of the diffusing layer 8 is preferably between 1 mm and 8 mm, particularly preferably 2 mm.

The semiconductor chips are designed as surface emitters, in particular as thin-film chips. The first semiconductor chip 3 is embodied as an AlGaInP semiconductor chip that emits electromagnetic radiation in the red and/or yellow spectral range. The second semiconductor chip 4 is embodied as an InGaN semiconductor chip that emits electromagnetic radiation in the blue and/or green spectral range. A conversion layer 7 is arranged between the radiation exit surfaces 13, 17 of the semiconductor chips 3, 4 which face away from the carrier 2 and the diffusing layer 8. The conversion layer 7 converts electromagnetic radiation from the blue spectral range 15 into the green to yellow spectral range. The conversion layer 7 preferably has a height of between 0.1 mm and 0.8 mm, particularly preferably 0.3 mm. A phosphorescent material 11, in particular phosphor particles composed of yttrium gallium aluminum garnet and/or lutetium aluminum garnet, is provided as conversion means.

The conversion means 11 is present in a concentration of 5 to 25 percent by weight with homogeneous distribution in a potting material 22. The InGaAlP and the InGaN semiconductor chips 3, 4 are potted in a single potting, in particular in the form of a planar volume potting. The semiconductor chips 3, 4 are cast laterally up to the height of their active layers in silicone 16 filled with titanium dioxide. The reflectivity of the silicone filled with titanium dioxide can be greater than 95%. Lateral, reflective walls 5 are provided, which are seated perpendicularly on the carrier 2. In an alternative that is not shown, the lateral walls 5 are situated obliquely on the carrier 2 and form an angle≠90 degrees with the carrier 2. The light diameter 9, that is to say the lateral extent of the light exit facet, can be between 3 mm and 50 mm. Typically, the light diameter 9 is between 10 mm and 20 mm. The luminous flux varies between 1000 and 4000 lumens in the exemplary embodiments claimed in the present case.

Figure 1A:
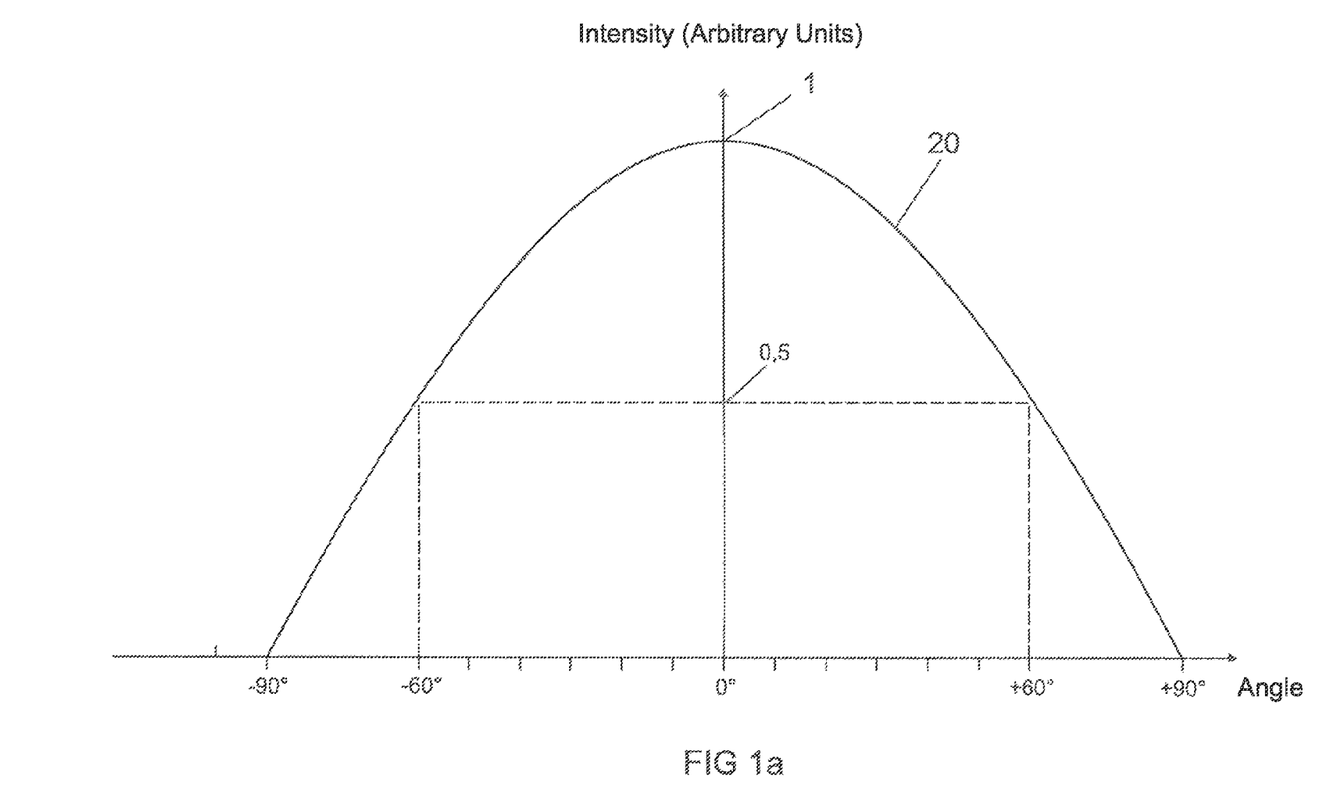
FIG. 1a shows the emission profile of the optoelectronic component from FIG. 1.

FIG. 1a schematically shows the emission profiles associated with the optoelectronic component from FIG. 1. The optoelectronic component has a Lambertian emission profile 20. The radiation intensity in different spatial directions is proportional to the cosine of the emission angle. This means that in the case of 60 degrees deflection from the normal (0 degrees) the light intensity has fallen to 50% of the maximum value, and to 0% in the case of 90 degrees. The full width at half maximum is 120 degrees, namely from −60 degrees to +60 degrees.

Figure 2:
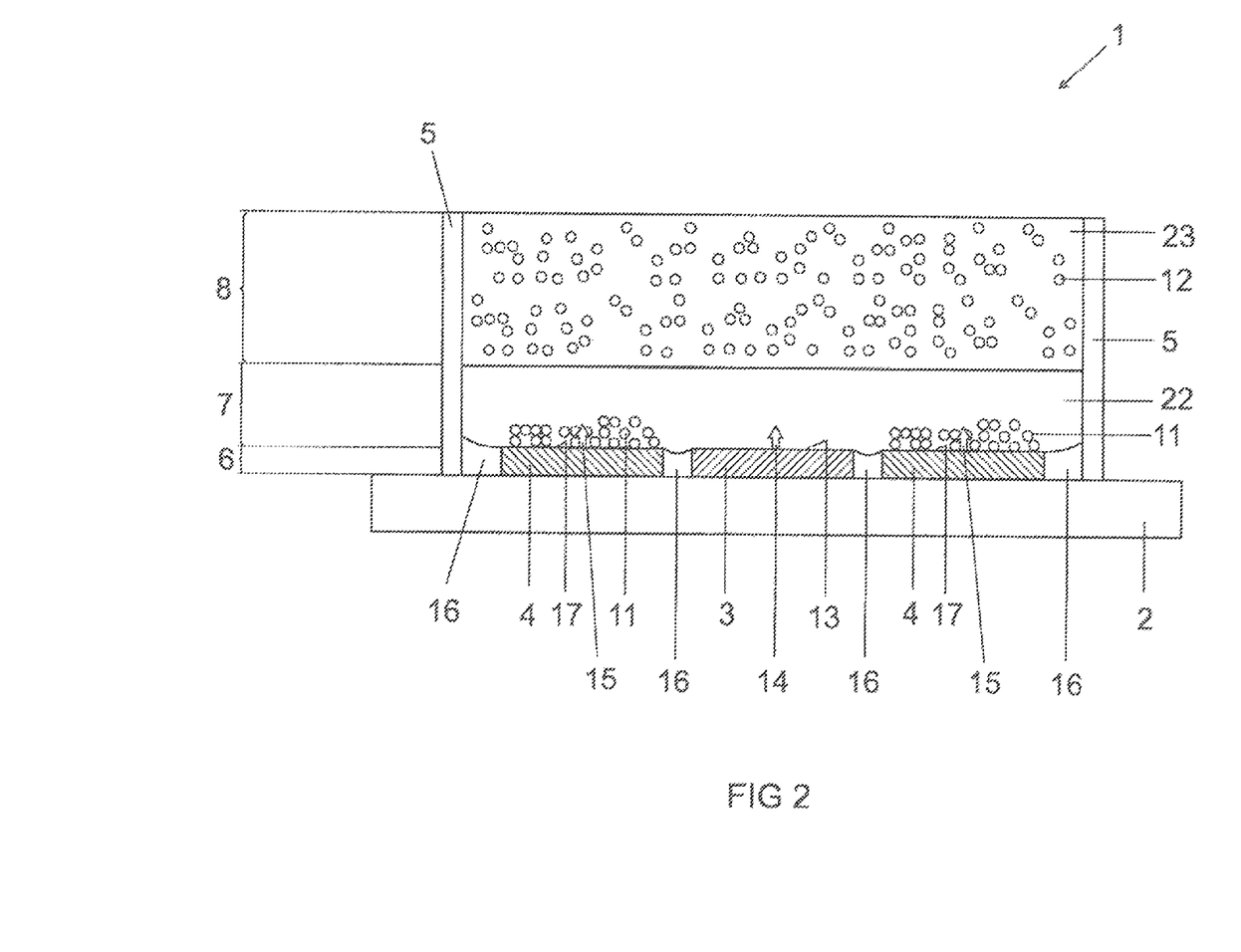
FIG. 2 shows a section through an optoelectronic component.

FIG. 2 shows, in contrast to FIG. 1, an exemplary embodiment in which the phosphorescent material 11 is distributed inhomogeneously in the conversion layer 7. The phosphorescent material 11 is present in the form of plates arranged on the radiation exit surface 17 of the InGaN semiconductor chips 4. The plates are embedded in potting material 22 at least in regions. No phosphorescent material 11 is provided on the radiation exit surface 13 of the InGaAlP semiconductor chip 3. Therefore, the red light emitted by the AlGaInP semiconductor chip 3 is not absorbed in the conversion layer 7. Furthermore, the description of FIG. 1 is also applicable to FIG. 2.

Figure 3:
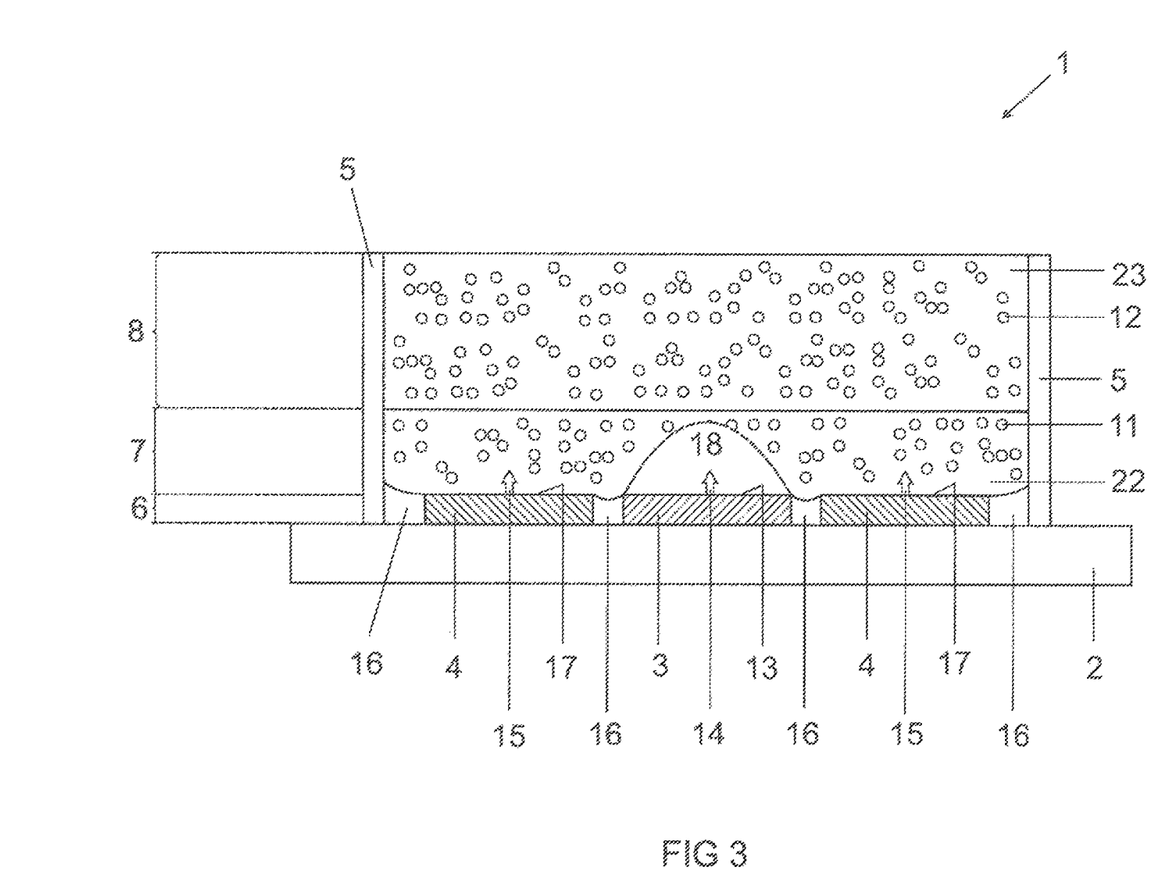
FIG. 3 shows a section through an optoelectronic component.

FIG. 3 shows, in contrast to FIG. 1, an exemplary embodiment in which the phosphorescent material 11 is distributed inhomogeneously. In the case of the exemplary embodiment shown in FIG. 1, a few percent of the light intensity of the red light is lost as a result of the phosphor particles 11 above the AlGaInP semiconductor chip 3 as a result of scattering and/or absorption. In order to reduce this effect, in the exemplary embodiment shown in FIG. 3, a drop of clear potting material 18 is applied to the radiation exit surface 13 of the InGaAlP semiconductor chip 3. This is also called lens on chip (LOC). Furthermore, the description of FIG. 1 is also applicable to FIG. 3.

Figure 4:
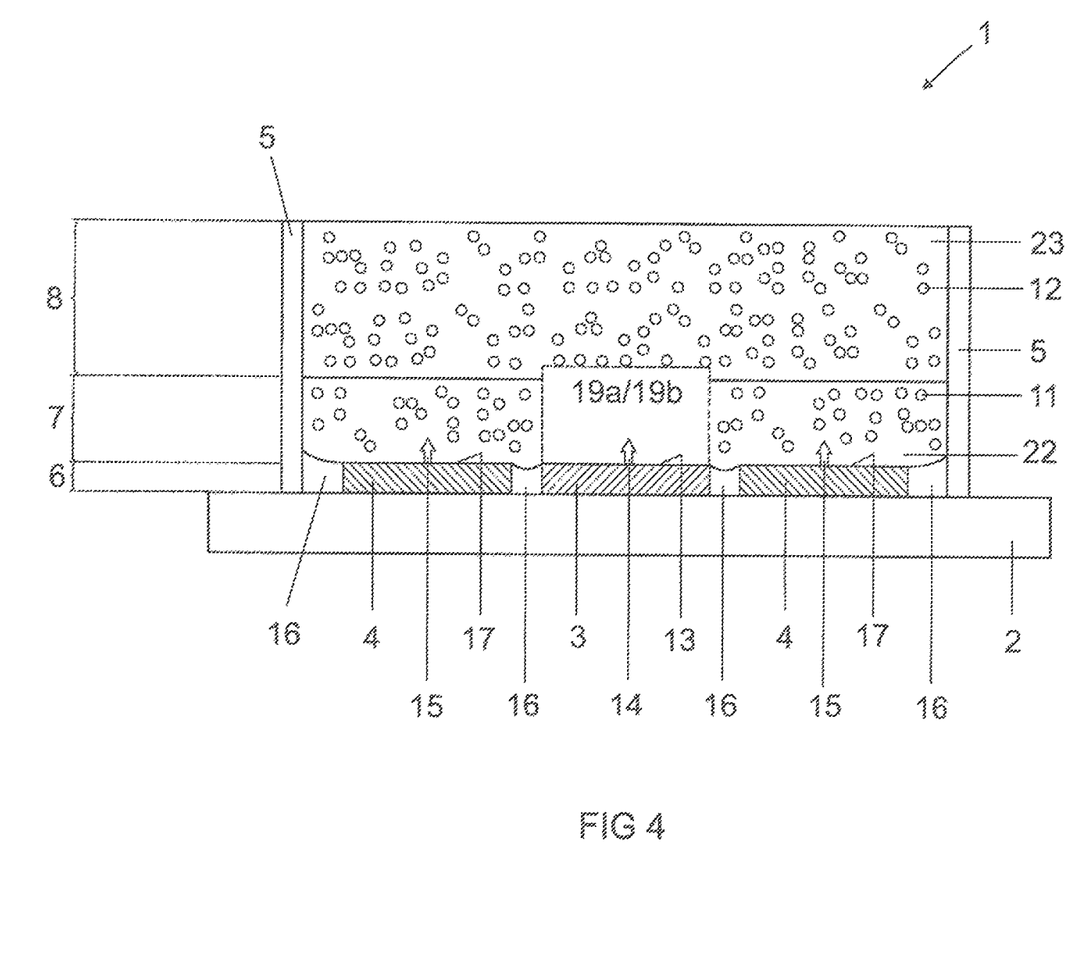
FIG. 4 shows a section through an optoelectronic component.

FIG. 4 shows, in contrast to FIG. 1, an exemplary embodiment in which the phosphorescent material 11 is distributed inhomogeneously. In order to reduce scattering and/or absorption, molded glass 19a or a silicone plate 19b is applied to the radiation exit surface 13 of the InGaAlP semiconductor chip 3. The molded glass 19a and the silicone plate 19b can project into the diffusing layer. What is thereby achieved is that no phosphor particles 11 whatsoever are present above the InGaAlP semiconductor chip 3. Furthermore, the description of FIG. 1 is also applicable to FIG. 4.

Figure 5:
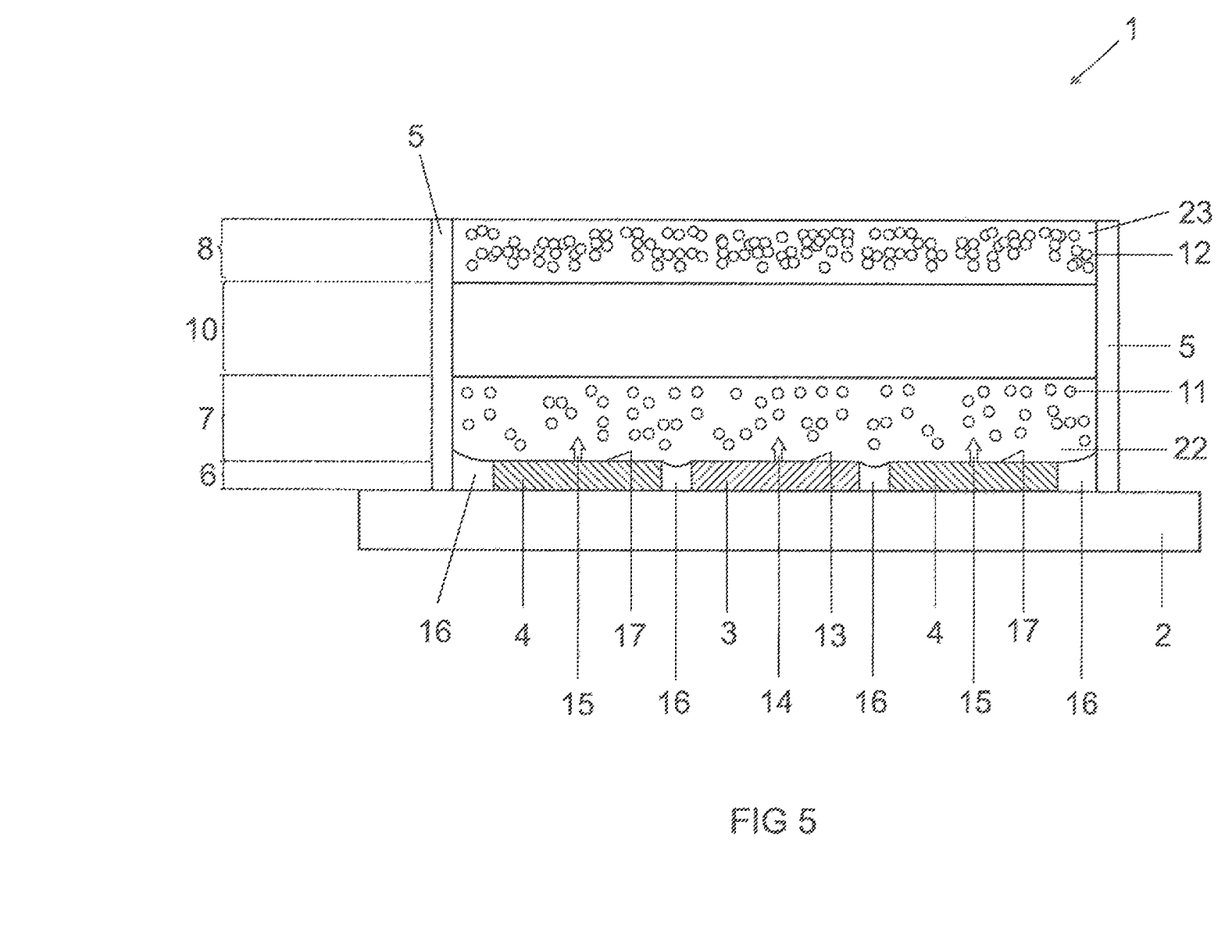
FIG. 5 shows a section through an optoelectronic component.

FIG. 5 shows an exemplary embodiment in which a free light mixing layer 10 is provided on that side of the diffusing layer 8 which faces the carrier 2. The free light mixing layer 10 is freed of scattering particles 12 and phosphorescent material 11. The thickness of the free light mixing layer 10 is between 20% and 98%, preferably 50%, of the total thickness of diffusing layer 8 and free light mixing layer 10. The diffusing layer 8 therefore does not concern the entire volume above the conversion layer 7, but rather is situated in the upper light mixing region. As a result of the free propagation of the electromagnetic radiation in the free light mixing layer 10, the light emitted by the semiconductor chips mixes partly already before impinging on the diffusing layer 8. Furthermore, the description of FIG. 1 is also applicable to FIG. 5.

Figure 6:
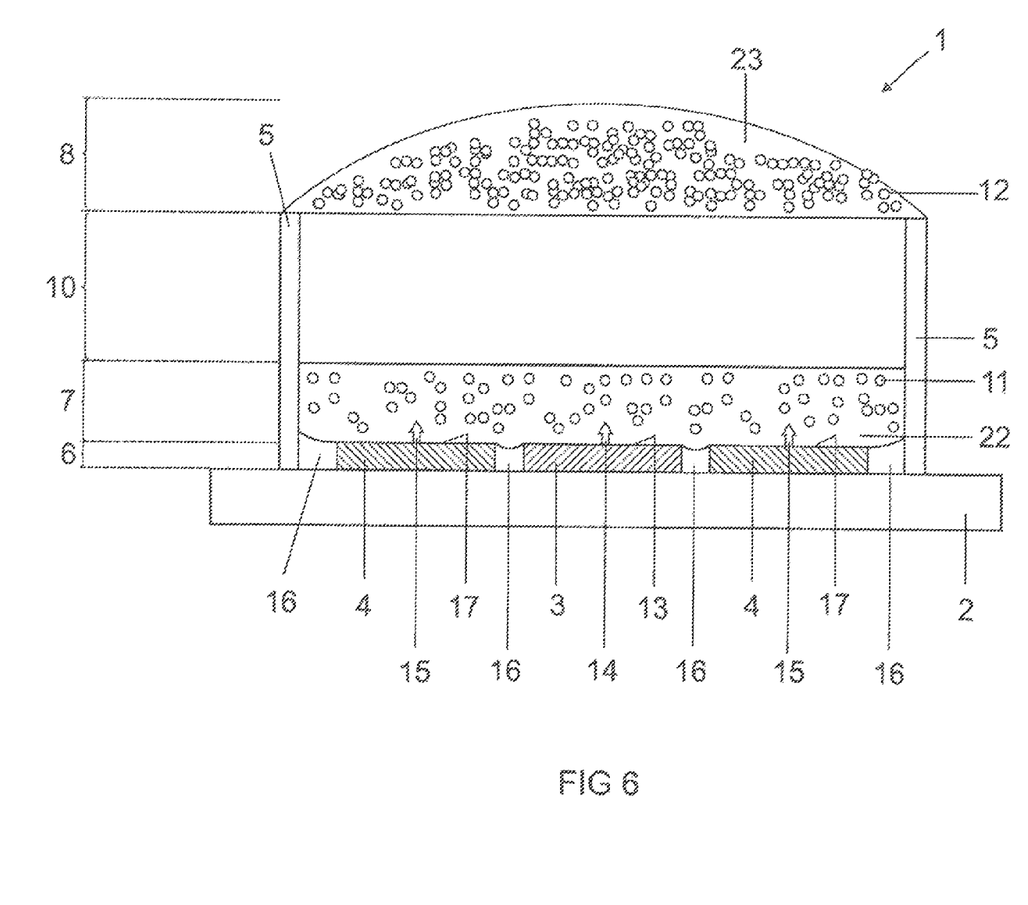
FIG. 6 shows a section through an optoelectronic component.

FIG. 6 shows, in contrast to FIG. 5, an exemplary embodiment in which the diffusing layer 8 has the form of a lens. The diffusing layer terminates flush with the lateral walls 5. In the center between the lateral walls, the diffusing layer has its maximum thickness. In other words, the maximum number of scattering particles 12 is provided centrally. After free propagation in the free light mixing layer 10, the light emitted by the semiconductor chips 3, 4 impinges on the scattering particles 12. This leads to a radiation distribution which is wider than the Lambertian distribution with regard to its angular distribution. Furthermore, the description of FIG. 5 is also applicable to FIG. 6.

Figure 6A:
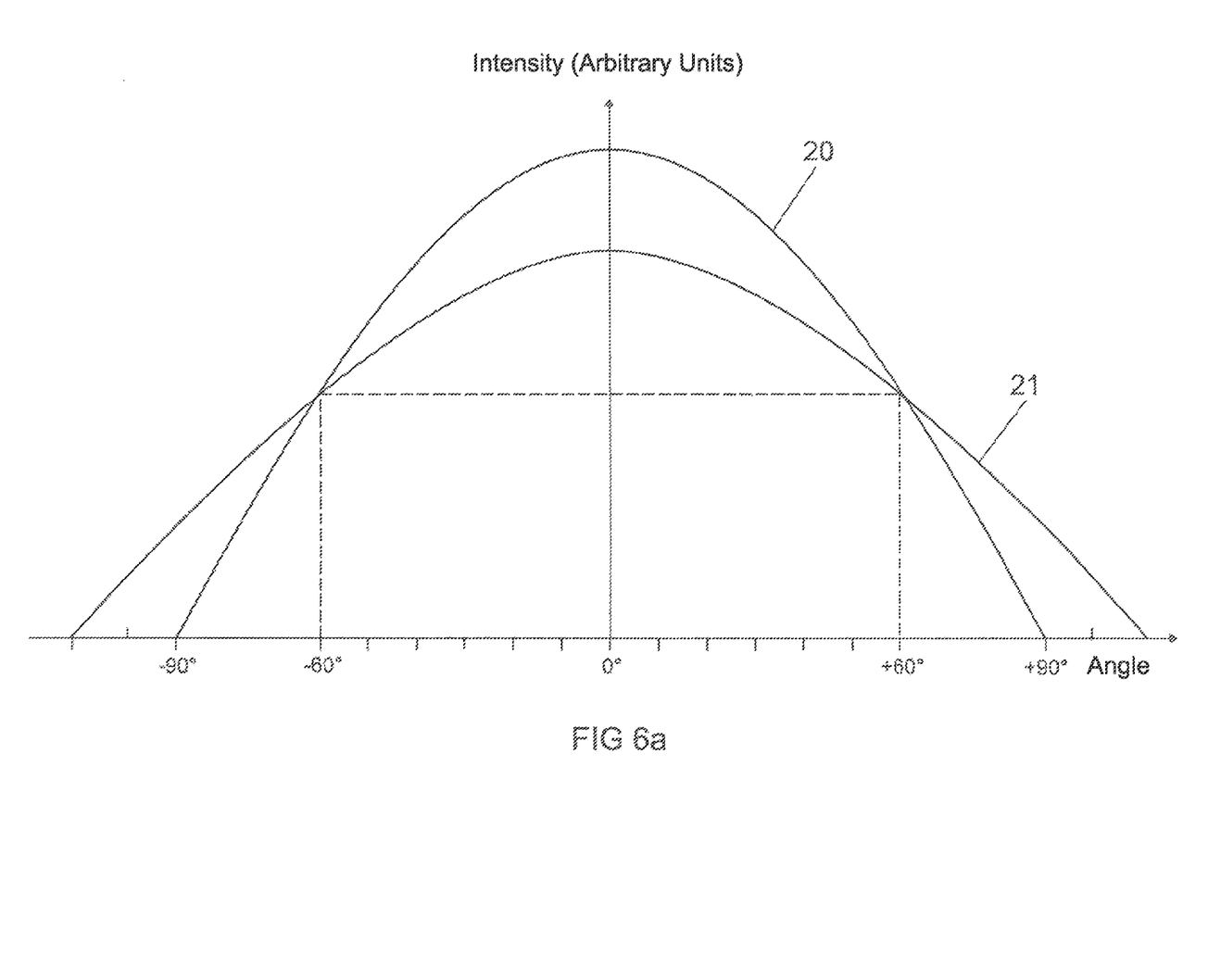
FIG. 6a shows the emission profile of the optoelectronic component from FIG. 6.

FIG. 6a schematically shows the emission profile 21 associated with the optoelectronic component from FIG. 6. The lens form of the conversion layer 7 causes an emission profile 21 which is wider than a Lambertian emission profile 20 with regard to the angular distribution. The non-Lambertian emission profile 21 exhibits a higher intensity than the Lambertian emission profile for angles of greater than approximately 60 degrees. Moreover, the non-Lambertian emission profile 21, in contrast to the Lambertian emission profile 20, has non-vanishing intensities for emission angles of greater than 90 degrees.

Figure 7:
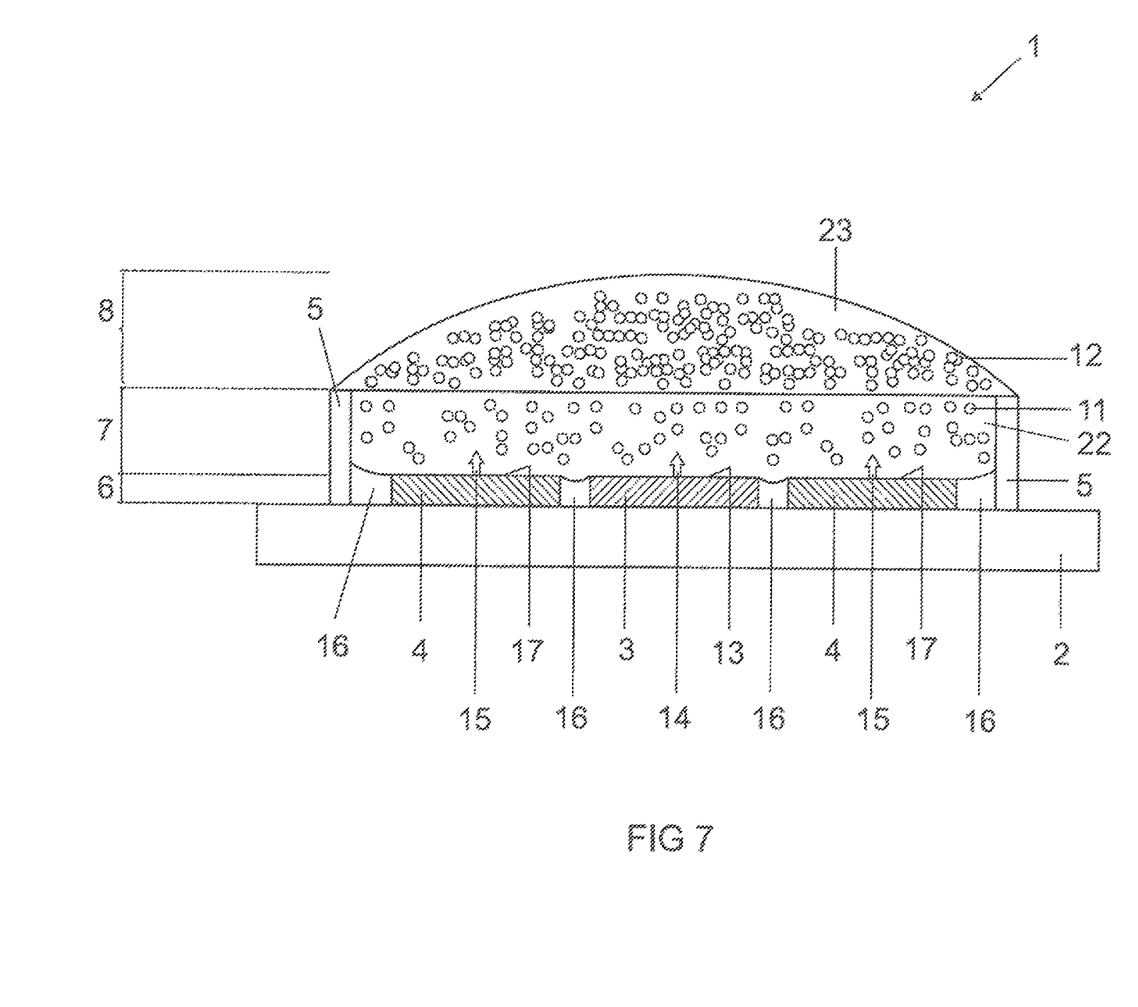
FIG. 7 shows a section through an optoelectronic component.

FIG. 7 shows, in contrast to FIG. 6, an exemplary embodiment in which no free light mixing layer 10 is provided between the diffusing layer 8 in lens form and the conversion layer 7. The emission profile 21 corresponds to that in FIG. 6a. The free light mixing layer 10 is not absolutely necessary. However, more scattering particles 12 have to be used in order to achieve the same color mixing quality as in the exemplary embodiment from FIG. 6. This leads to a lower efficiency. Furthermore, the description of FIG. 6 is also applicable to FIG. 7.

Figure 8:
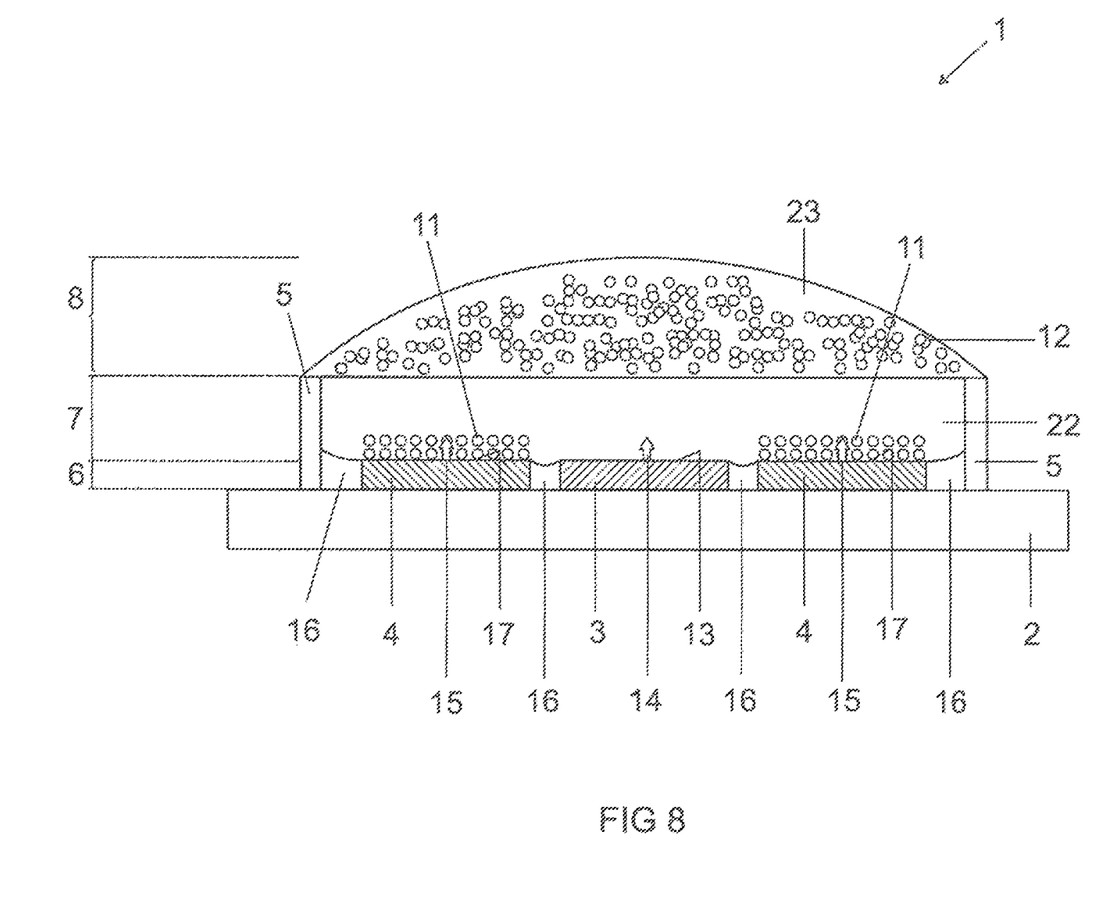
FIG. 8 shows a section through an optoelectronic component.

FIG. 8 shows, like FIG. 2 already, an exemplary embodiment in which the phosphorescent material 11 is distributed inhomogeneously in the conversion layer 7. The phosphorescent material 11 is present in the form of plates arranged on the radiation exit surface 17 of the InGaN semiconductor chips 4. No phosphorescent material 11 is provided on the radiation exit surface 13 of the InGaAlP semiconductor chip 3. The light emitted by the AlGaInP semiconductor chip 3 is not absorbed in the conversion layer 7. In contrast to FIG. 2, the diffusing layer 8 has the form of a lens. The diffusing layer terminates flush with the lateral walls 5. In the center between the lateral walls, the diffusing layer has its maximum thickness. In other words, the maximum number of scattering particles 12 is provided centrally.

Figure 9:
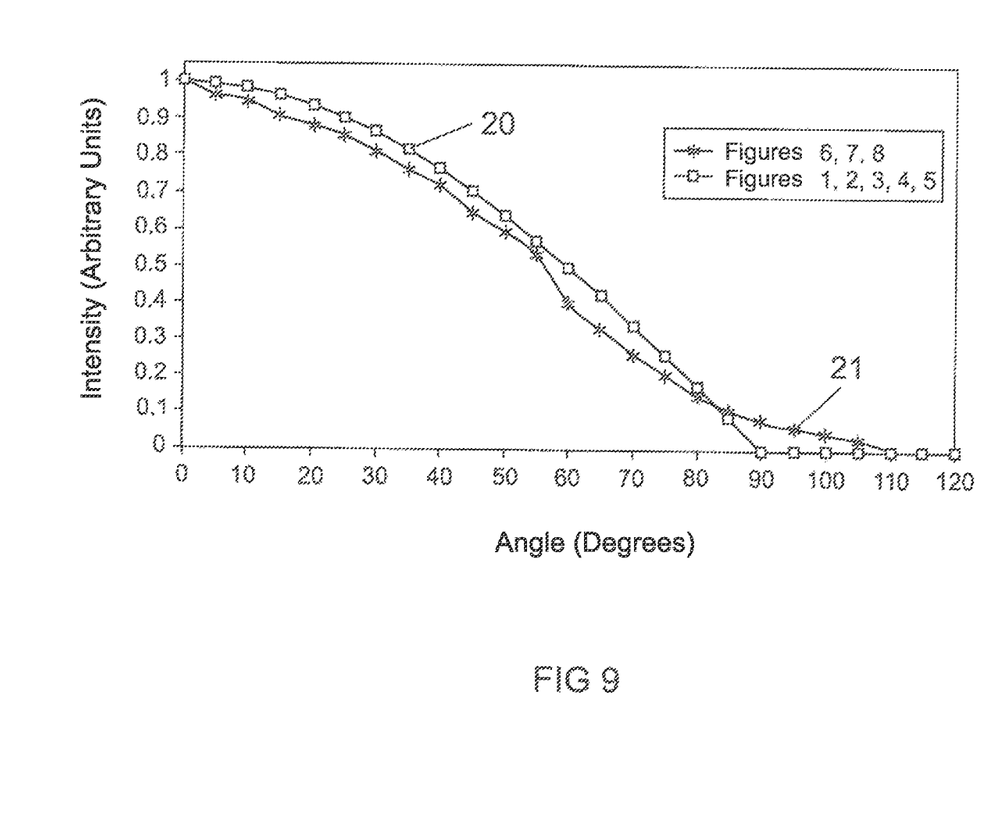
FIG. 9 shows the angle-dependent intensity distribution of the various embodiments of the optoelectronic components.

FIG. 9 shows the simulated emission profiles with regard to the exemplary embodiments in FIGS. 1, 2, 3, 4, 5, 6, 7 and 8. The emission profiles with regard to the exemplary embodiments in FIGS. 1, 2, 3, 4, and 5 are identical in the simulation. A Lambertian emission profile 20 is manifested in each case. In particular, the intensity at 90 degrees falls to zero. The emission profiles with regard to the exemplary embodiments in FIGS. 6, 7 and 8 are identical in the simulation. An emission profile 21 which is wider than a Lambertian emission profile 20 with regard to the angular distribution is manifested in each case. In particular, the intensity at 90 degrees is approximately 10% of the maximum intensity at zero degrees. It is only at approximately 110 degrees that the intensity falls to zero.

Figure 10:
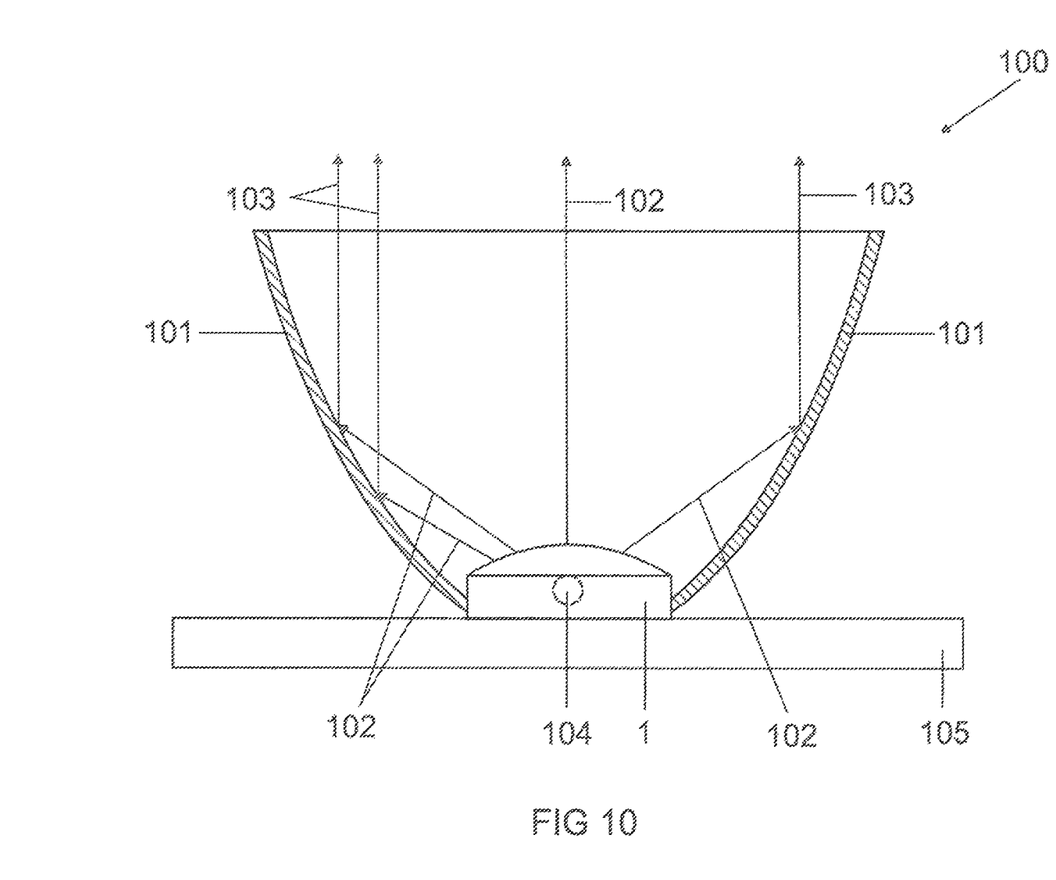
FIG. 10 shows a section through a lighting device.

FIG. 10 shows a lighting device 100 comprising an optoelectronic component 1. The optoelectronic component 1 is coupled to a secondary optical unit in the form of a reflector 101. The mixed light 102 emitted by the optoelectronic component is reflected by the reflector 101 in the forward direction. The greater the angle at which the optoelectronic component 1 emits light, the higher the intensity of the mixed light 103 reflected by the reflector 101 in the forward direction. The reflector 101 can have the form of a parabola at least in regions. The optoelectronic component 1 is situated in the plane of the focal point 104 of the parabola. The parabola minimum is absent. In other words, the reflector 101 has only the side walls of a parabola. The reflector 101 terminates flush with the optoelectronic component 1.

The optoelectronic component has been described on the basis of some exemplary embodiments in order to illustrate the underlying concept. In this case, the exemplary embodiments are not restricted to specific combinations of features. Even if some features and configurations have been described only in connection with a particular exemplary embodiment or individual exemplary embodiments, they can in each case be combined with other features from other exemplary embodiments. It is likewise conceivable to omit or add individual presented features or particular configurations in exemplary embodiments, provided that the general technical teaching is still realized.

What is claimed is:

1. An optoelectronic component for mixing electromagnetic radiation having different wavelengths in a far field, the component comprising:
   a carrier;
   a first semiconductor chip arranged on the carrier and having a first radiation exit surface for emitting electromagnetic radiation in a first spectral range;
   a second semiconductor chip arranged on the carrier and having a second radiation exit surface for emitting electromagnetic radiation in a second spectral range;
   a diffusing layer overlying the radiation exit surfaces of the first and second semiconductor chips;
   a conversion layer between the radiation exit surfaces of the semiconductor chips and the diffusing layer; and
   a clear material arranged in the conversion layer above the first semiconductor chip, wherein the clear material extends from the first semiconductor chip to the diffusion layer, wherein the clear material directly adjoins the first radiation exit surface, the conversion layer and the diffusion layer, and wherein the clear material does not cover the second radiation exist surface.

2. The optoelectronic component according to claim 1, wherein the first semiconductor chip comprises an AlGaInP semiconductor chip that emits electromagnetic radiation in a red and/or yellow spectral range.

3. The optoelectronic component according to claim 1, wherein the second semiconductor chip comprises an InGaN semiconductor chip that emits electromagnetic radiation in a blue and/or green spectral range.

4. The optoelectronic component according to claim 1, wherein the first and the second semiconductor chips are potted in a single potting.

5. The optoelectronic component according to claim 4, wherein the single potting is a planar volume potting.

6. The optoelectronic component according to claim 1, wherein a phosphorescent material is provided in the conversion layer, the phosphorescent material being present in a concentration of 5 to 25 percent by weight.

7. The optoelectronic component according to claim 1, wherein scattering particles are provided in the diffusing layer.

8. The optoelectronic component according to claim 7, wherein the scattering particles are present in a concentration of 0.05 to 50 percent by weight.

9. The optoelectronic component according to claim 1, wherein the clear material is in the form of a lens on chip.

10. The optoelectronic component according to claim 1, further comprising a free light mixing layer on that side of the diffusing layer that faces the carrier, the light mixing layer being free of diffusing material and conversion means and covering the first semiconductor chip and the second semiconductor chip.

11. The optoelectronic component according to claim 1, wherein the first and second semiconductor chips are cast up to a level of their active layers in silicone filled with titanium dioxide, having a reflectivity of greater than 95%.

12. The optoelectronic component according to claim 1, wherein the diffusing layer has the form of a lens.

13. The optoelectronic component according to claim 1, wherein lateral, reflective walls are seated on the carrier.

14. A lighting device comprising an optoelectronic component according to claim 1, wherein the optoelectronic component is coupled to a reflector.

15. The lighting device according to claim 14, wherein the reflector has the form of a parabola at least in regions.

* * * * *